United States Patent
Lee et al.

(10) Patent No.: US 10,061,966 B2
(45) Date of Patent: Aug. 28, 2018

(54) FINGERPRINT IDENTIFICATION APPARATUS

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

(21) Appl. No.: 15/626,397

(22) Filed: Jun. 19, 2017

(65) Prior Publication Data

US 2017/0372119 A1 Dec. 28, 2017

(30) Foreign Application Priority Data

Jun. 27, 2016 (TW) .............................. 105120177 A

(51) Int. Cl.
  *G06K 9/00* (2006.01)
(52) U.S. Cl.
  CPC ....... *G06K 9/00053* (2013.01); *G06K 9/0002* (2013.01); *H01L 2224/48091* (2013.01); *H01L 2924/10155* (2013.01)
(58) Field of Classification Search
  CPC ........... G06K 9/00087; G06K 9/00053; G06K 9/0002
  See application file for complete search history.

(56) References Cited

U.S. PATENT DOCUMENTS

| 2015/0294135 A1* | 10/2015 | Kim | ........................ H01L 23/04 382/124 |
| 2016/0247009 A1* | 8/2016 | Lu | ............................. G06K 9/00 |

FOREIGN PATENT DOCUMENTS

| CN | 101482918 A | 7/2009 |
| TW | M513407 U | 12/2015 |
| TW | M522419 U | 5/2016 |

OTHER PUBLICATIONS

Office Action dated Dec. 9, 2016 of the corresponding Taiwan patent application.

* cited by examiner

*Primary Examiner* — Ruiping Li
(74) *Attorney, Agent, or Firm* — Chun-Ming Shih; HDLS IPR Services

(57) ABSTRACT

A fingerprint identification apparatus includes a fingerprint identification IC chip, a polymer film substrate and a decorative layer. The fingerprint identification IC chip comprises a plurality of metal bumps arranged on one side of the fingerprint identification IC chip. The polymer film substrate comprises a plurality of conductive pads and arranged on one side of the fingerprint identification IC chip with the metal bumps. At least part of the conductive pads is corresponding to and electrically connected to the metal bumps. The decorative layer is arranged on one side of the polymer film substrate opposite to the fingerprint identification IC chip.

18 Claims, 11 Drawing Sheets

FINGERPRINT IDENTIFICATION APPARATUS

BACKGROUND OF THE INVENTION

Field of the Invention

The present invention relates to a fingerprint identification apparatus, especially to a fingerprint identification apparatus with improved yield.

Description of Related Art

Biometric identification technologies have rapid development due to the strong demand from electronic security applications and remote payment. The biometric identification technologies can be classified into fingerprint identification, iris identification and DNA identification and so on. For the considerations of efficiency, safety and non-invasiveness, the fingerprint identification becomes main stream technology. The fingerprint identification device can scan fingerprint image by optical scanning, thermal imaging or capacitive imaging. For cost, power-saving, reliability and security concerns, the capacitive fingerprint sensor becomes popular for biometric identification technology applied to portable electronic devices.

The conventional capacitive fingerprint sensors can be classified into swipe type and area type (pressing type), and the area type has better identification correctness, efficiency and convenience. However, the area type capacitive fingerprint sensor generally integrates the sensing electrodes and the sensing circuit into one integrated circuit (IC) because the sensed signals are minute and the background noise is huge in comparison with the minute sensed signals. In conventional area type technique, holes are defined on the protection glass of the display to arrange the fingerprint identification IC chip therein and sapphire film is used to cover and protect the fingerprint identification IC chip. Through-silicon via (TSV) technique is used to lead the conductive wires to backside of the fingerprint identification IC chip. As a result, the material cost and package cost is high while the yield is influenced. There are development trends to simply the package the fingerprint identification IC chip and to enhance the sensing ability. The fingerprint identification IC chip is desirably packaged under the protection glass to reduce cost and enhance product lifetime/durability.

FIG. 6A is sectional view showing a related-art fingerprint identification apparatus. The fingerprint identification apparatus 10 comprises, from bottom to top, a packaging substrate 700, a packaging epoxy 250, a decorative layer 300 and a protection layer 400. The packaging substrate 700 comprises a contact face 700a and a plurality of first contacts 112. The packaging epoxy 250 comprises a first face 250a and a second face 250b and contains a fingerprint identification IC chip 252, a plurality of sensing electrodes 254, a plurality of second contacts 256 and a plurality of bonding wires 258. The decorative layer 300 comprises a mounting face 300a and a contact face 300b opposite to the mounting face 300a. The protection layer 400 comprises an attaching face 400a and an operative face 400b opposite to the attaching face 400a. As shown in FIG. 6A, the user finger operates on the operative face 400b. However, in the shown fingerprint identification apparatus 10, the first contacts 112 and the second contacts 256 are in one-by-one correspondence through the bonding wires 258. The bonding wires 258 in the packaging epoxy 250 have risk of breaking if user exerts excessive force, which may cause erroneous sensing. Moreover, the bonding wires 258 need a height to allow bending thereof; this increases a distance between the user finger and the sensing electrodes 254 by 10 um and causes detrimental impact on measuring accuracy.

FIG. 6B is sectional view showing another related-art fingerprint identification apparatus. The fingerprint identification apparatus shown in FIG. 6B is similar to that shown in FIG. 6A; however, the fingerprint identification apparatus 10 shown in FIG. 6B does not include the decorative layer 300 of FIG. 6A and the protection layer 400 is a sapphire film in the packaging epoxy 250. The sapphire film has difficult process and high cost. Besides, the bonding wires 258 in the packaging epoxy 250 of FIG. 6B also have risk of breaking if user exerts excessive force.

FIG. 7 is sectional view showing still another related-art fingerprint identification apparatus. The fingerprint identification apparatus shown in FIG. 7 is similar to that shown in FIG. 6A. The fingerprint identification IC chip has recess on lateral side thereof to reduce vertical distance between the first contacts 112 and the second contacts 256, thus reducing the height of the bonding wires 258. However, the fingerprint identification apparatus 10 shown in FIG. 7 is System in Package (SIP) and has excessive cost. Moreover, the recess on the lateral side of the fingerprint identification IC chip also results in manufacture difficulty and higher cost.

SUMMARY OF THE INVENTION

It is an object of the present invention to provide a fingerprint identification apparatus to overcome above mentioned problems.

Accordingly, the present invention provides a fingerprint identification apparatus comprising: a fingerprint identification integrated circuit (IC) chip comprising a plurality of metal bumps arranged on one side of the fingerprint identification IC chip; a polymer film substrate comprising a plurality of conductive pads and the polymer film substrate arranged on one side of the fingerprint identification IC chip with the metal bumps, at least part of the conductive pads being corresponding to and electrically connected to the metal bumps; and a decorative layer arranged on one side of the polymer film substrate opposite to the fingerprint identification IC chip.

Accordingly, the present invention provides a method for manufacturing a fingerprint identification apparatus, the method comprising: providing a fingerprint identification (IC) chip, the fingerprint identification IC chip comprising a plurality of metal bumps arranged on one side of the fingerprint identification IC chip; providing a polymer film substrate, the polymer film substrate comprising a plurality of conductive pads arranged on one side of the polymer film substrate; forming a decorative layer on a side of the polymer film substrate opposite to the conductive pads by printing, depositing, sputtering, evaporating, or bonding; and pressing or soldering the fingerprint identification IC chip on a surface of the polymer film substrate such that the metal bumps and at least part of the conductive pads are in one by one correspondence.

The yield of the fingerprint identification apparatus is enhanced and the cost of the fingerprint identification apparatus 10 is reduced by attaching (assembling) the fingerprint identification IC chip, the polymer film substrate and the decorative layer.

BRIEF DESCRIPTION OF DRAWING

One or more embodiments of the present disclosure are illustrated by way of example and not limitation in the FIG. 1 is a schematic diagram showing the fingerprint identification apparatus according to the first embodiment of the present invention.

DETAILED DESCRIPTION OF THE INVENTION

Figure 1:
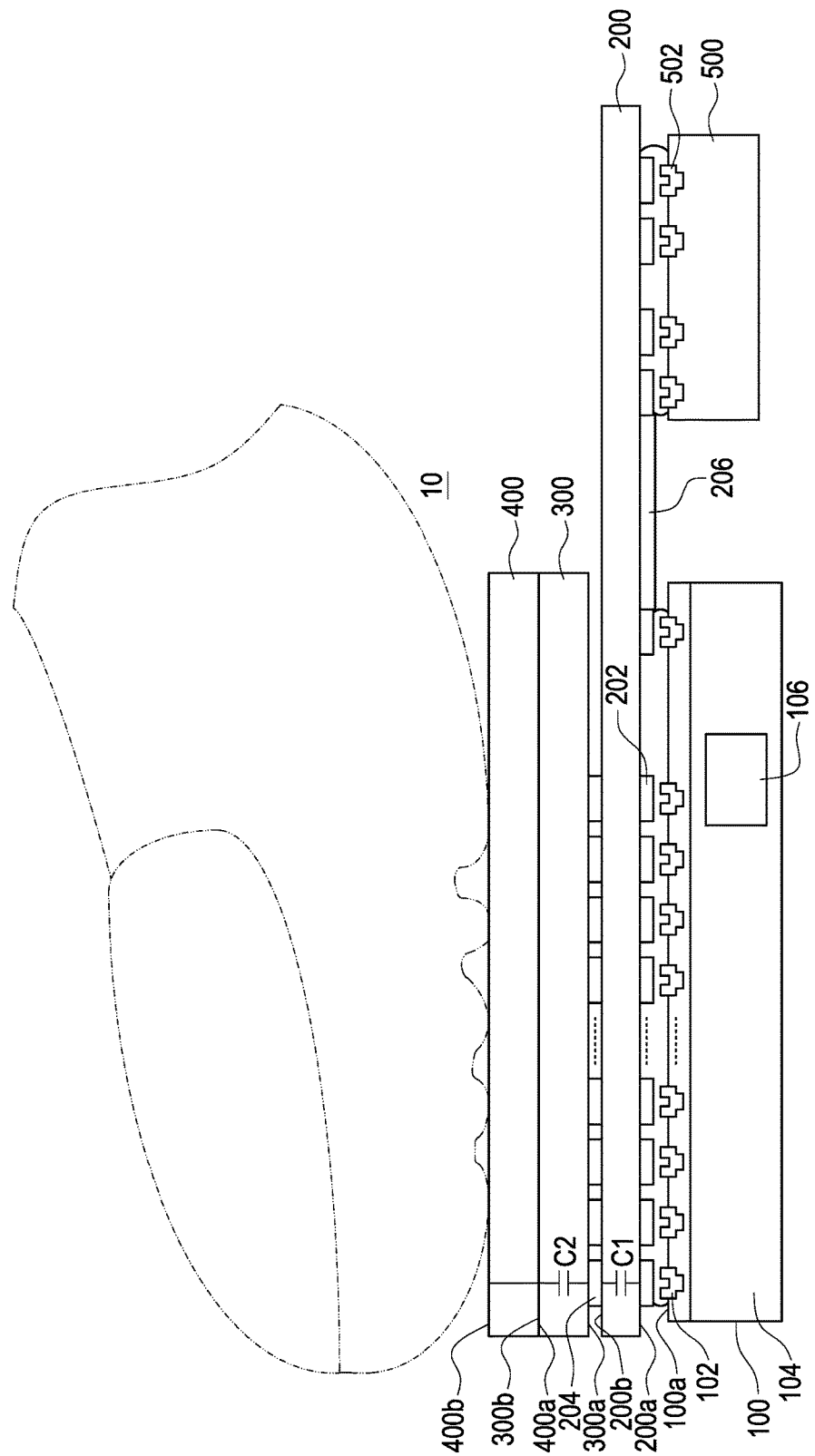

FIG. 1 is a schematic diagram showing the fingerprint identification apparatus 10 according to the first embodiment of the present invention. The fingerprint identification apparatus 10 comprises a fingerprint identification IC chip 100, a polymer film substrate 200, a decorative layer 300 and a protection layer 400. The fingerprint identification IC chip 100 comprises a contact face 100a, a plurality of metal bumps 102, and a fingerprint identification circuit 104, where the metal bumps 102 are arranged on a side of the fingerprint identification IC chip 100, namely, the contact face 100a of the fingerprint identification IC chip 100. The polymer film substrate 200 comprises a first face 200a, a second face 200b opposite to the first face 200a, a plurality of conductive pads 202 and a plurality of conductive electrodes 204. The polymer film substrate 200 is arranged on the contact face 100a of the fingerprint identification IC chip 100 and the conductive pads 202 are arranged on the first face 200a of the polymer film substrate 200, while the conductive electrodes 204 are arranged opposite to the fingerprint identification IC chip 100, namely, arranged on the second face 200b. The decorative layer 300 comprises a mounting face 300a and a connection face 300b opposite to the mounting face 300a. The protection layer 400 comprises an attaching face 400a and an operative face 400b opposite to the attaching face 400a. As shown in FIG. 1, the user finger is operated on the operative face 400b of the protection layer 400.

At least part of the conductive pads 202 on the first face 200a of the polymer film substrate 200 are electrically connected to the metal bumps 102 of the fingerprint identification IC chip 100. For example, the fingerprint identification IC chip 100 may be arranged on the polymer film substrate 200 through anisotropic conductive film (ACF) to achieve above electrical connection. Besides, the fingerprint identification IC chip 100 may be soldered on the polymer film substrate 200 through pressure soldering of a low melting point material to achieve electrical connection between part of the conductive pads 202 and the corresponding metal bumps 102. Moreover, the metal bumps 102 and part of the metal pads 202 are in one by one correspondence (one by one relationship). Another part of the conductive pads 202 can be electrically connected to metal bumps 502 on an integrated circuit 500 such that the fingerprint identification signal generated by the fingerprint identification IC chip 100 can be sent to the integrated circuit 500 through the polymer film substrate 200 for further processing. As shown in FIG. 1, the metal bumps 502 of the integrated circuit 500 can be electrically connected to the fingerprint identification IC chip 100 through the conductive pad 202 and the conductive trace 206 of the polymer film substrate 200. The fingerprint identification IC chip 100 further comprises a fingerprint identification circuit 104, which comprises a self-capacitance sensing circuit 106. The detail of the self-capacitance sensing circuit 106 can be referred to U.S. Pat. No. 8,704,539 (corresponding to Taiwan patent No. I473001) filed by the same applicant. Part of the description for the self-capacitance sensing circuit 106 will also be made later with reference to FIG. 10.

The protection layer 400 is faced down and attached to a surface of the decorative layer 300, namely, the attaching face 400a of the protection layer 400 is attached to the connection face 300b of the decorative layer 300. The decorative layer 300 is faced down and attached to a surface of the polymer film substrate 200, namely, the mounting face 300a of the decorative layer 300 is attached to the second face 200b of the polymer film substrate 200. The decorative layer 300 has a specific color or pattern to achieve a visual effect different with that of transparent layer. Alternatively, the decorative layer 300 may have color or pattern fit with (or matching with) the shell color or shell pattern of the electronic device (such as smart phone) on which the fingerprint identification apparatus 10 is used. As shown in FIG. 1, the decorative layer 300 may be arranged on the attaching face 400a of the protection layer 400 by printing, depositing, sputtering, evaporating, or bonding and so on. Moreover, in other embodiments, the decorative layer 300 may be arranged on the second face 200b of the polymer film substrate 200 by printing, depositing, sputtering, evaporating, attaching and so on.

More particularly, the locations of the conductive electrodes 204 and the locations of the part of the conductive pads 202 (those connected with the metal bumps 102) are in one by one correspondence (one by one relationship). When user finger presses on (or approaches) the operative face 400b of the protection layer 400, a second capacitor C2 is formed between a contact point of user finger and the corresponding conductive electrodes 204; while a first capacitor C1 is formed between the corresponding conductive electrodes 204 and the corresponding conductive pad 202. The thickness of the polymer film substrate 200 is far less than the thickness of the protection layer 400 plus the thickness of the decorative layer 300 such that the capacitance of the first capacitor C1 is far larger than the capacitance of the second capacitor C2. Therefore, the capacitance of the serially connected first capacitor C1 and second capacitor C2 is almost the same as the capacitance of the second capacitor C2 alone. The insertion of the polymer film substrate 200 between the decorative layer 300 and the fingerprint identification IC chip 100 will not influence the precision of fingerprint identification. In the present invention, the metal bumps 102 of the fingerprint identification IC chip 100 is attached to the thin polymer film substrate 200 through anisotropic conductive film (ACF), or soldered on the polymer film substrate 200 through pressure soldering. Namely, the fingerprint identification IC chip 100 is not directly attached to or soldered to the decorative layer 300. The protection layer 400 is for example protection glass of a display, or a protection substrate for thin film transistor of display screen. Moreover, the protection layer 400 may be a glass layer, a ceramic layer, a sapphire layer, a hard polymer material layer, or a cured coating layer. In above fingerprint identification apparatus 10, the robustness thereof can be enhanced because no connection wire is used. Moreover, the decorative layer 300 also provides desired visual effect for the fingerprint identification apparatus 10 and the fingerprint identification apparatus 10 can be advantageously applied to electronic device (such as smart phone) with specific shell color or specific shell pattern.

Figure 2:
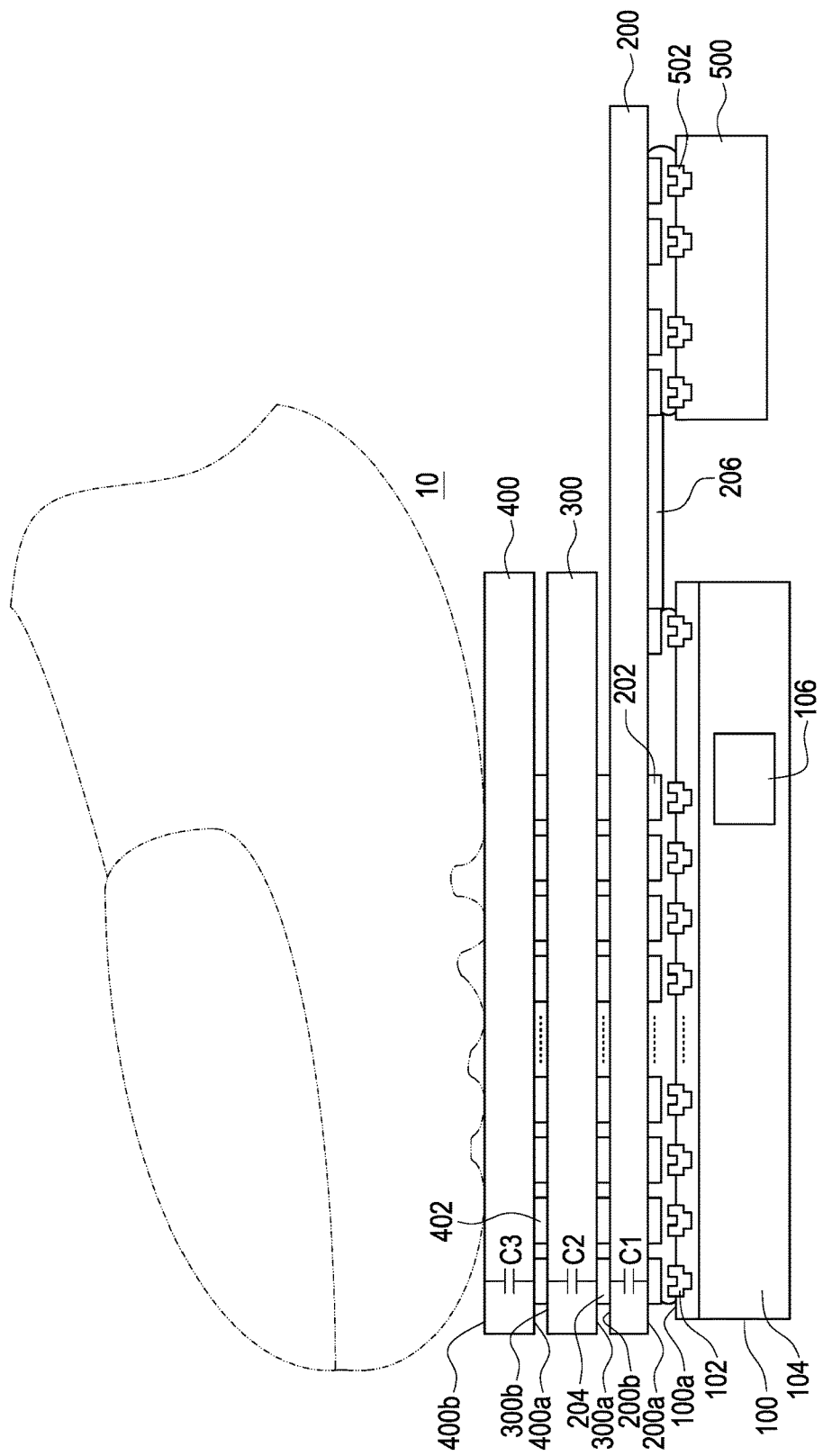
FIG. 2 is a schematic diagram showing the fingerprint identification apparatus according to the second embodiment of the present invention.

FIG. 2 is a schematic diagram showing the fingerprint identification apparatus 10 according to the second embodiment of the present invention. The embodiment shown in FIG. 2 is similar to that shown in FIG. 1. The protection layer 400 in the fingerprint identification apparatus 10 shown in FIG. 2 further comprises a plurality of conductive electrodes 402 and the conductive electrodes 402 are arranged on the attaching face 400a of the protection layer 400. The locations of the conductive electrodes 402 and the locations of the part of the conductive pads 202 (those connected with the metal bumps 102) are in one by one correspondence (one by one relationship). When user finger presses on (or approaches) the operative face 400b of the protection layer 400, a third capacitor C3 is formed between a contact point of user finger and the corresponding conductive electrodes 402, and a second capacitor C2 is formed between the corresponding conductive electrodes 402 and the corresponding conductive electrodes 204. The first capacitor C1 will not influence the measurement result due to the extreme thin thickness of the polymer film substrate 200. Similarly, the fingerprint identification apparatus 10 shown in FIG. 2 also has simple package. The yield of the fingerprint identification apparatus 10 is enhanced and the cost of the fingerprint identification apparatus 10 is reduced by attaching (assembling) the fingerprint identification IC chip 100, the polymer film substrate 200 and the decorative layer 300.

Figure 3:
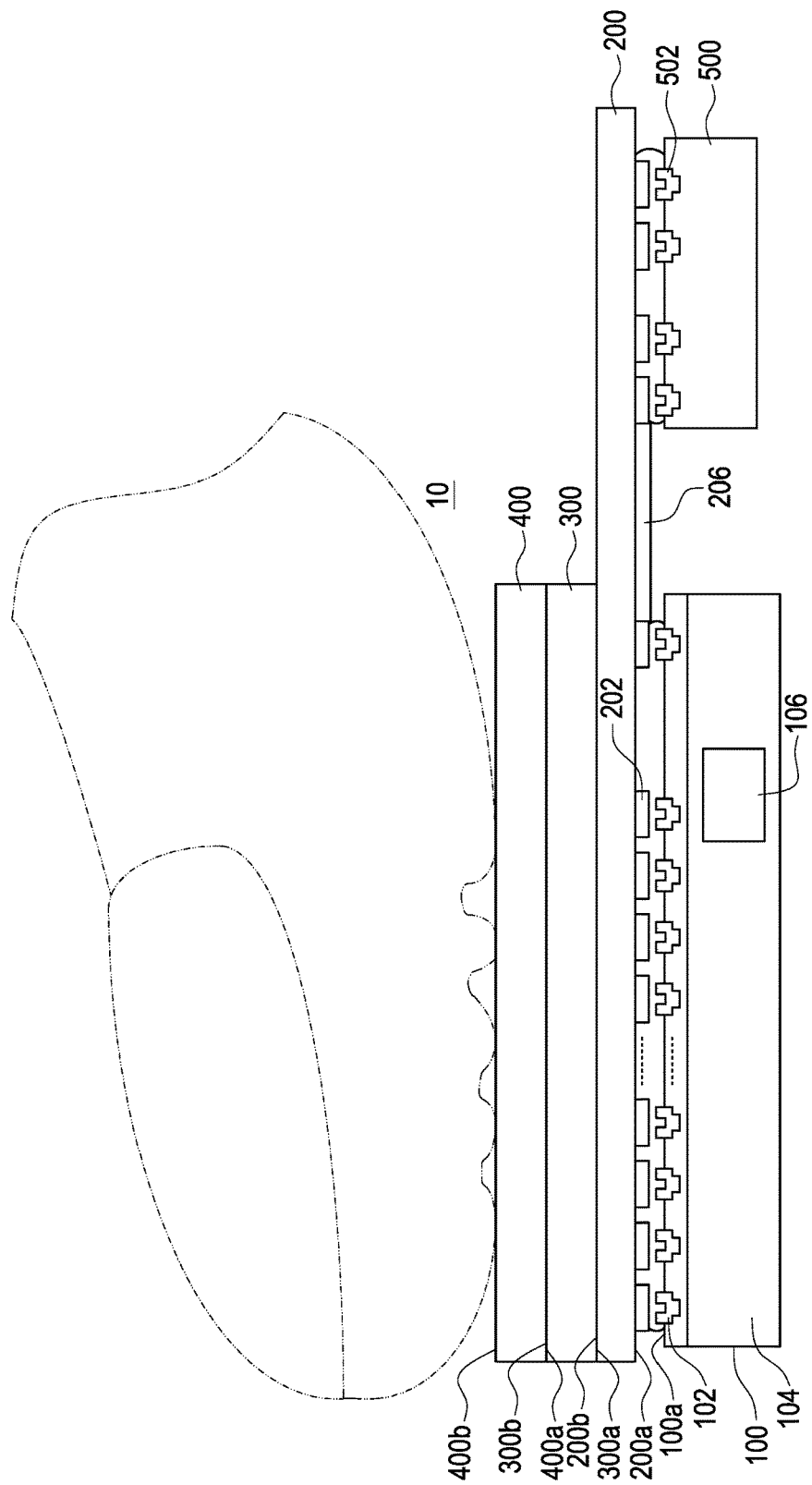
FIG. 3 is a schematic diagram showing the fingerprint identification apparatus according to the third embodiment of the present invention.

FIG. 3 is a schematic diagram showing the fingerprint identification apparatus 10 according to the third embodiment of the present invention. The embodiment shown in FIG. 3 is similar to that shown in FIG. 1 while the embodiment shown in FIG. 3 does not have the conductive electrodes 204, namely, the decorative layer 300 is faced down and attached to the second face 200b of the polymer film substrate 200. The decorative layer 300 may be arranged on the second face 200b of the polymer film substrate 200 by printing, depositing, sputtering, evaporating, or bonding and so on. In above-mentioned three embodiments, the material of the decorative layer 300 may be, for example but not limited to, ink, colored photo resist, fluorine compound, ceramic material, organic material or inorganic material.

Figure 4:
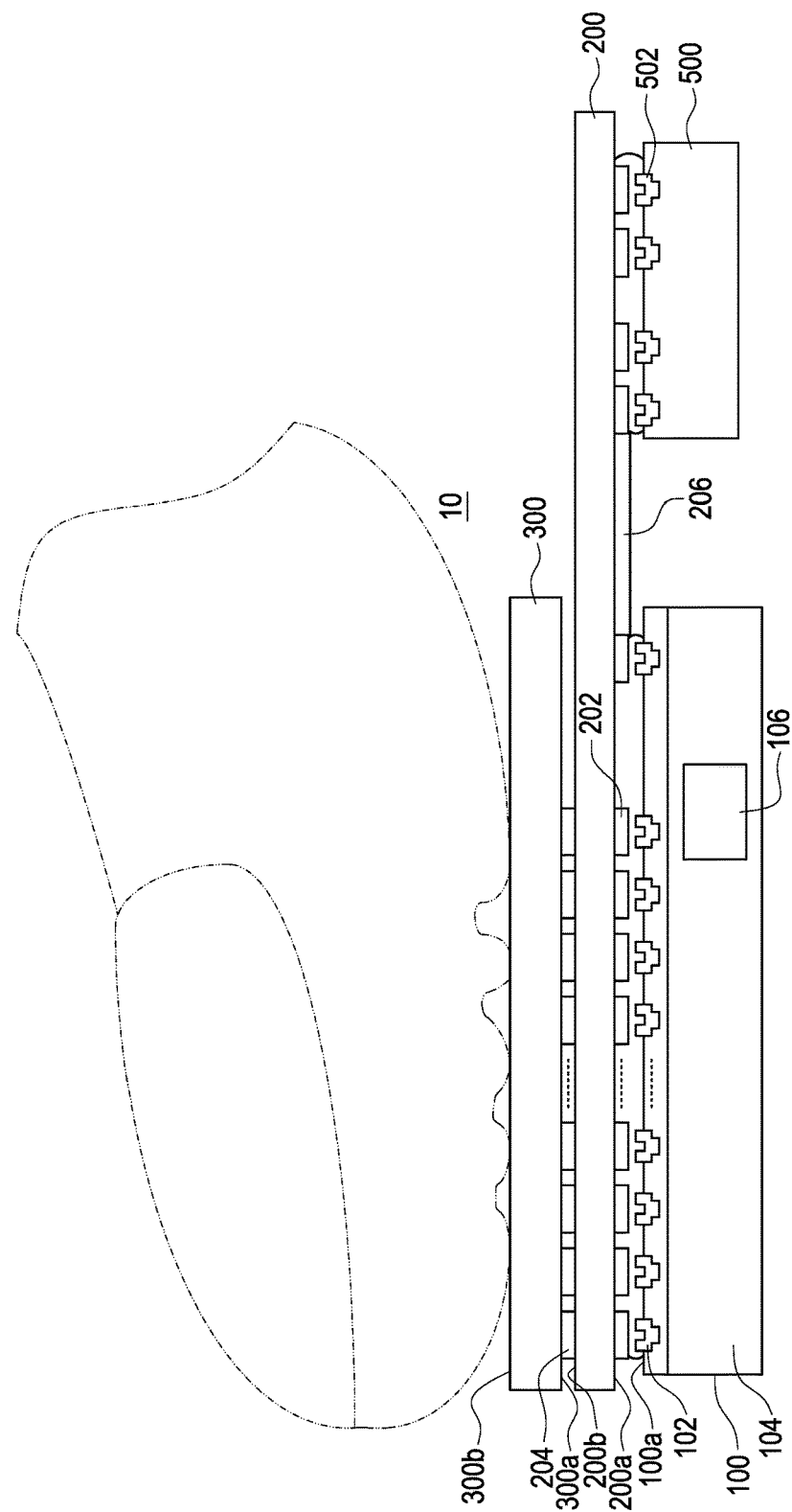
FIG. 4 is a schematic diagram showing the fingerprint identification apparatus according to the fourth embodiment of the present invention.

FIG. 4 is a schematic diagram showing the fingerprint identification apparatus 10 according to the fourth embodiment of the present invention. The embodiment shown in FIG. 4 is similar to that shown in FIG. 1 while the embodiment shown in FIG. 4 can be dispensed with the protection layer 400. Namely, user finger operates on the connection face 300b of the decorative layer 300. The decorative layer 300 may be a glass layer, a ceramic layer, a sapphire layer, a hard polymer material layer, or a cured coating layer. The material of the decorative layer 300 may be, for example but not limited to, ink, colored photo resist, fluorine compound, ceramic material, organic material or inorganic material. The decorative layer 300 may have such material to achieve the protection of the protection layer 400.

Figure 5:
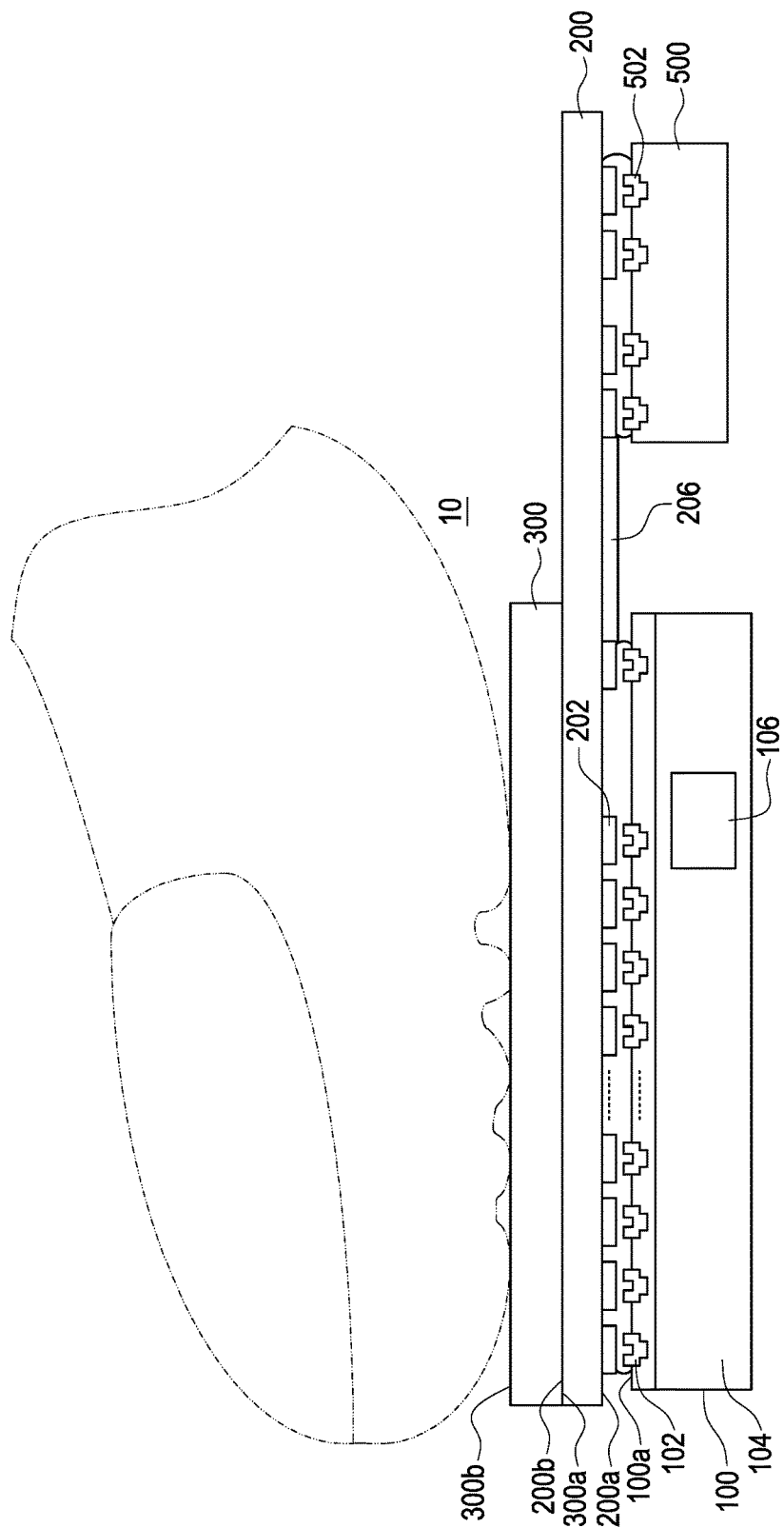
FIG. 5 is a schematic diagram showing the fingerprint identification apparatus according to the fifth embodiment of the present invention.
Figure 6A:
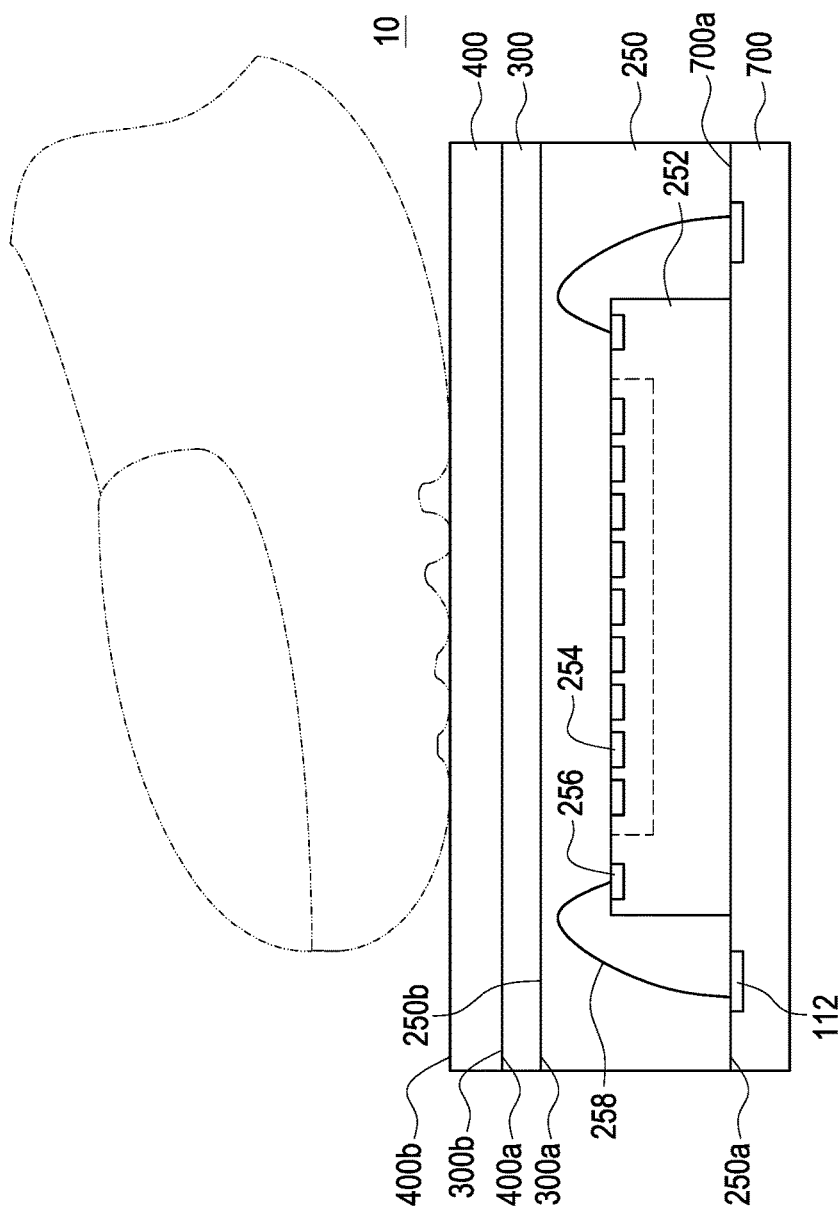
FIG. 6A is sectional view showing a related-art fingerprint identification apparatus.
Figure 6B:
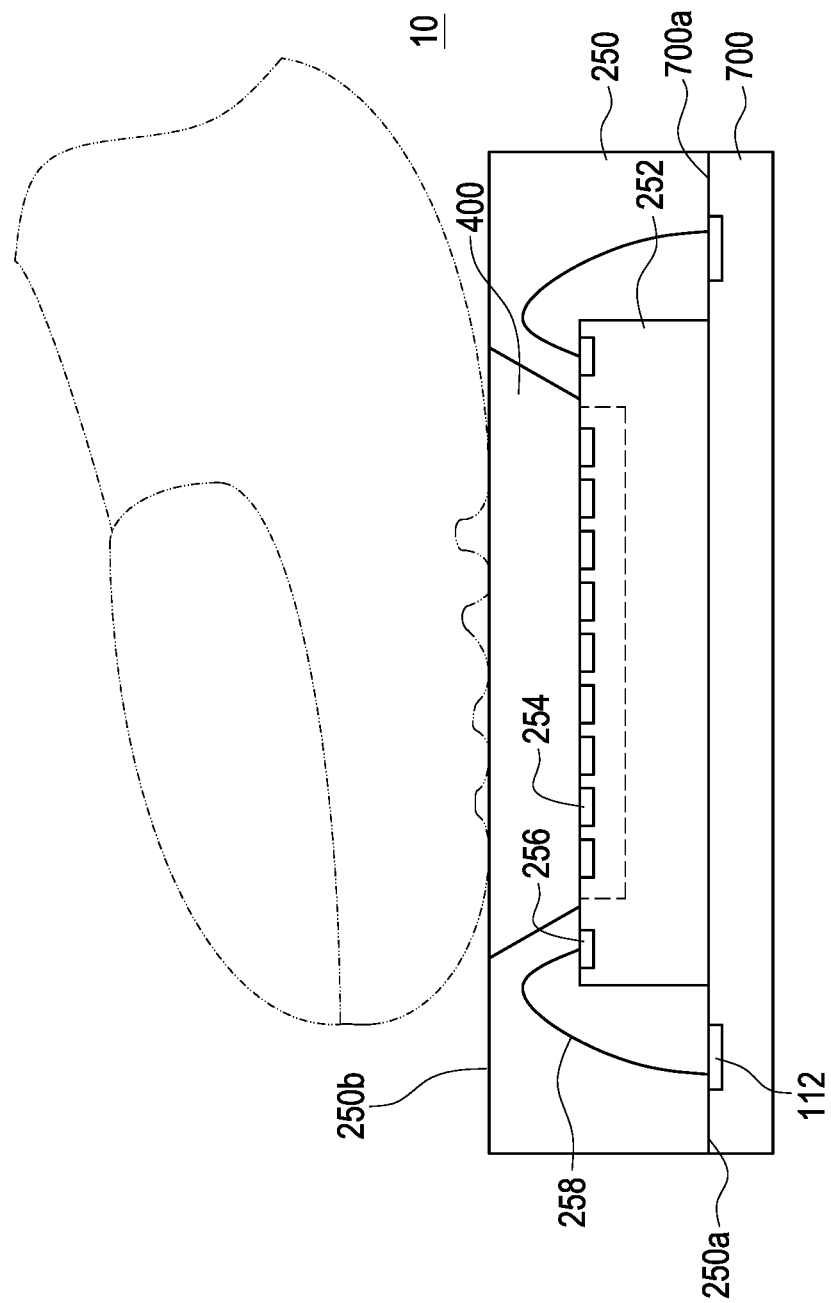
FIG. 6B is sectional view showing another related-art fingerprint identification apparatus.
Figure 7:
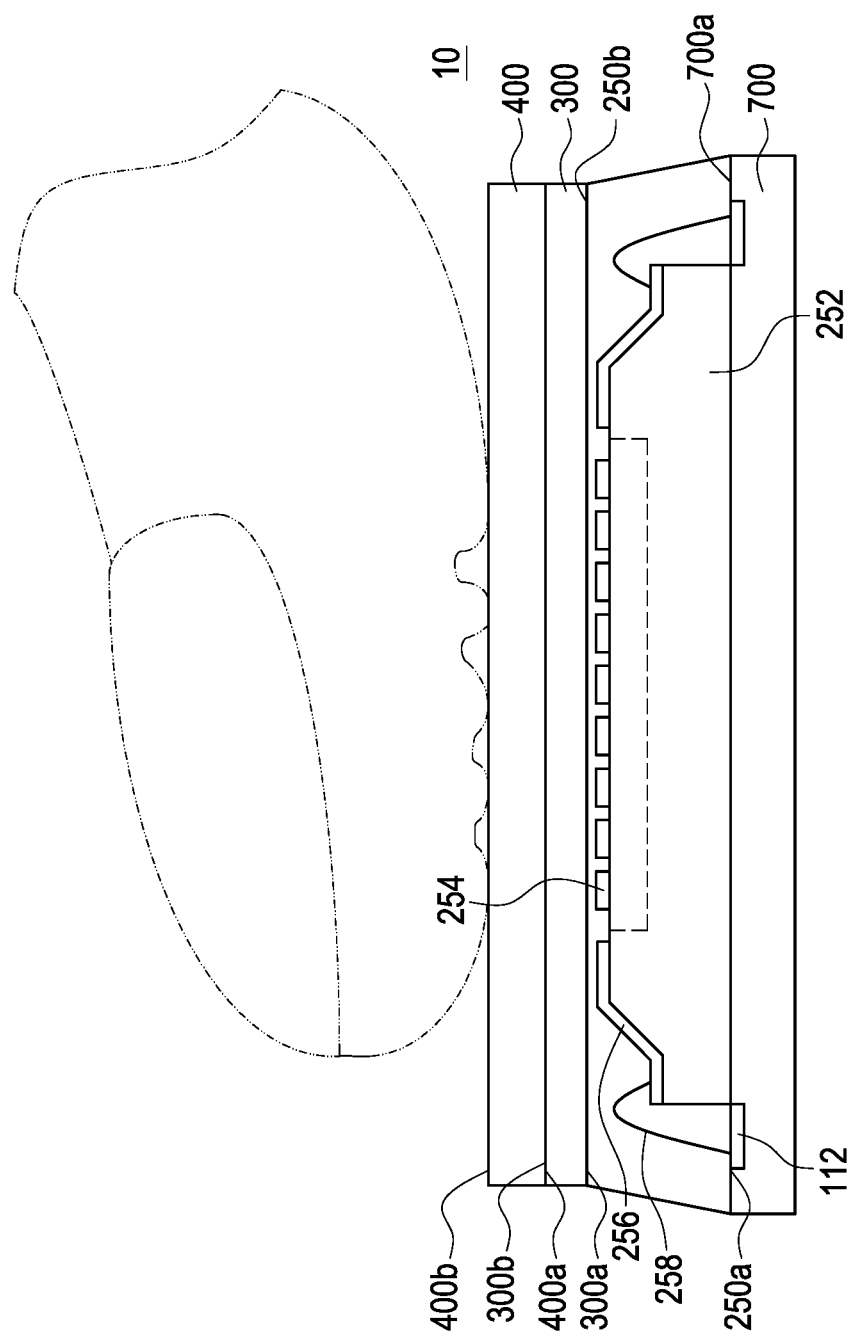
FIG. 7 is sectional view showing still another related-art fingerprint identification apparatus.

FIG. 5 is a schematic diagram showing the fingerprint identification apparatus 10 according to the fifth embodiment of the present invention. The embodiment shown in FIG. 5 is similar to that shown in FIG. 3 while the embodiment shown in FIG. 5 can be dispensed with the protection layer 400. Namely, user finger operates on the connection face 300b of the decorative layer 300. The decorative layer 300 may be a glass layer, a ceramic layer, a sapphire layer, a hard polymer material layer, or a cured coating layer. The material of the decorative layer 300 may be, for example but not limited to, ink, colored photo resist, fluorine compound, ceramic material, organic material or inorganic material. The decorative layer 300 may have such material to achieve the protection of the protection layer 400.

Figure 8:
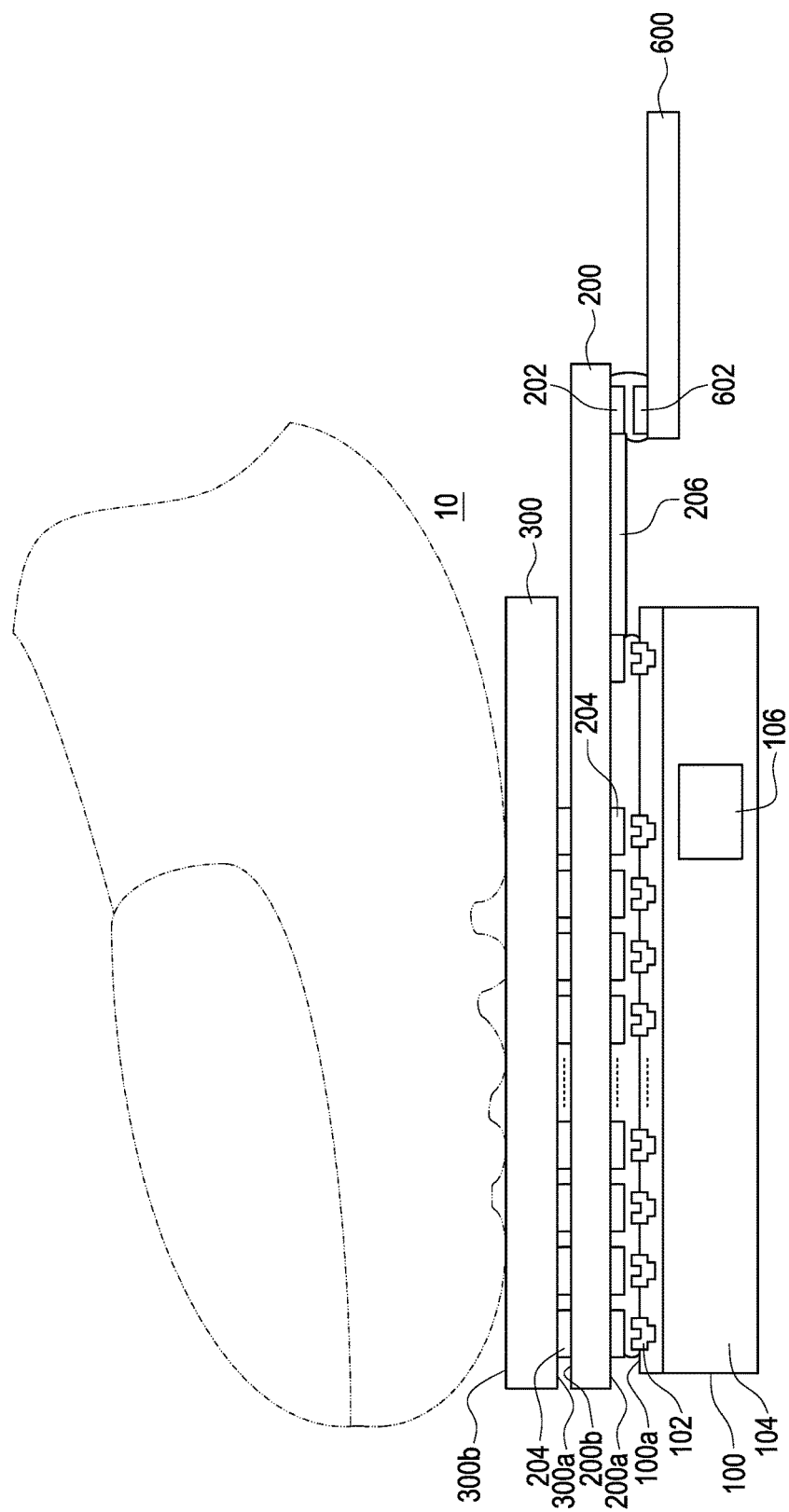
FIG. 8 is a schematic diagram showing the fingerprint identification apparatus according to the sixth embodiment of the present invention.

FIG. 8 is a schematic diagram showing the fingerprint identification apparatus 10 according to the sixth embodiment of the present invention. The embodiment shown in FIG. 8 is similar to that shown in FIG. 4 while the embodiment shown in FIG. 8 uses a flexible circuit board 600 to replace the integrated circuit 500. The flexible circuit board 600 further comprises a conductive pad 602 and another part of the conductive pads 202 of the polymer film substrate 200 may electrically connect with the corresponding conductive pad 602 on the flexible circuit board 600. Therefore, the fingerprint identification signal generated by the fingerprint identification IC chip 100 can be sent to the flexible circuit board 600 through the polymer film substrate 200 and then sent to other external device (not shown) through the flexible circuit board 600 for further processing.

Figure 9:
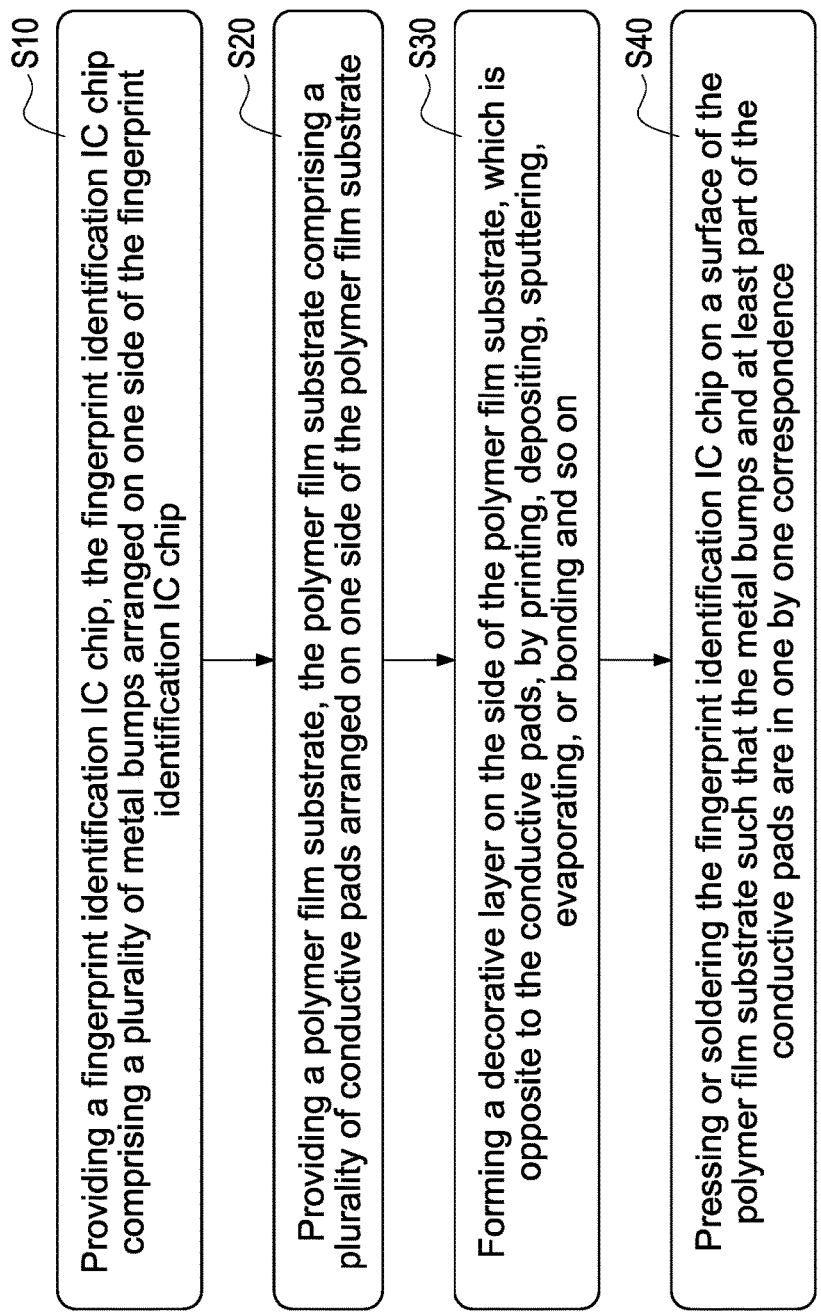
FIG. 9 is a schematic diagram showing the fingerprint identification apparatus according to the sixth embodiment of the present invention.

FIG. 9 shows a flowchart of method for manufacturing the fingerprint identification apparatus according to the present invention. The method includes (S10) providing a fingerprint identification IC chip, the fingerprint identification IC chip comprising a plurality of metal bumps arranged on one side of the fingerprint identification IC chip; (S20) providing a polymer film substrate, the polymer film substrate comprising a plurality of conductive pads arranged on one side of the polymer film substrate; (S30) forming a decorative layer on the side of the polymer film substrate, which is opposite to the conductive pads, by printing, depositing, sputtering, evaporating, or bonding and so on; (S40) pressing or soldering the fingerprint identification IC chip on a surface of the polymer film substrate such that the metal bumps and at least part of the conductive pads are in one by one correspondence (one by one relationship).

Moreover, the method for manufacturing the fingerprint identification apparatus further comprises: coating a hard material with high dielectric constant to a side of the decorative layer 300, which is opposite to the polymer film substrate 200; or attaching a hard material with high dielectric constant to a side of the decorative layer 300, which is opposite to the polymer film substrate 200. The hard material with high dielectric constant may be a sapphire material, a ceramic material or a glass material. Moreover, the method for manufacturing the fingerprint identification apparatus further comprises: pressing an electronic device outside the fingerprint identification IC chip 100 on the polymer film substrate 200, where the electronic device may comprise an integrated circuit. The fingerprint identification IC chip 100 may be arranged on the polymer film substrate 200 through anisotropic conductive film (ACF). Alternatively, the fingerprint identification IC chip 100 may be soldered on the polymer film substrate 200 through pressure soldering of a low melting point material.

Figure 10:
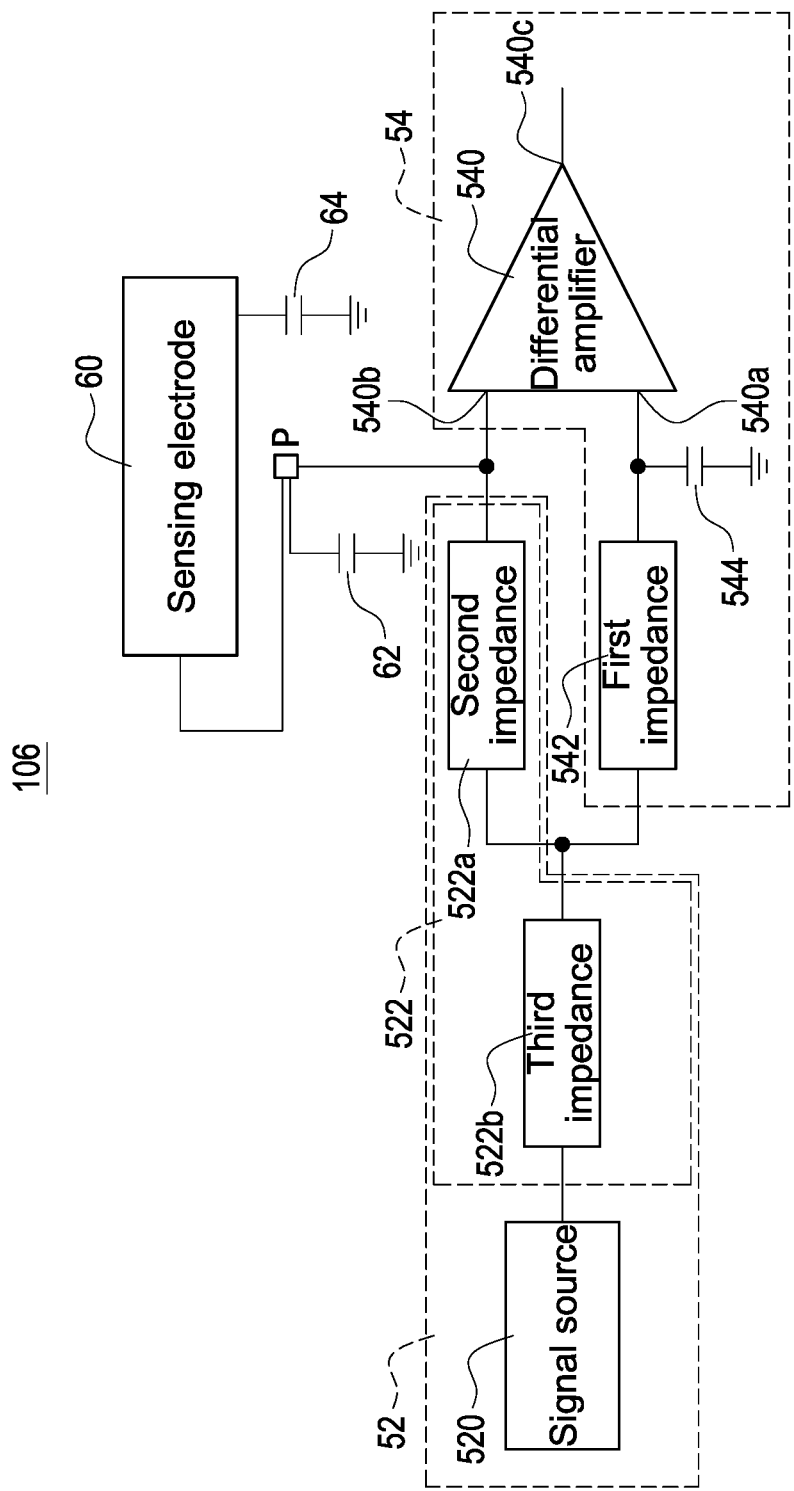
FIG. 10 shows the circuit diagram of the self-capacitance sensing circuit according to an embodiment of the present invention.

FIG. 10 shows the circuit diagram of the self-capacitance sensing circuit 106 according to an embodiment of the present invention. The self-capacitance sensing circuit 106 mainly comprises a capacitance-excitation driving circuit 52 and a capacitance measuring circuit 54 to sense a capacitance change at the sensing point P. The capacitance-excitation driving circuit 52 comprises a signal source 520 and a driving unit 522 (including a second impedance 522a and a third impedance 522b). The capacitance measuring circuit 54 comprises a differential amplifier 540, a first impedance 542 and a first capacitor 544 and is used to sense a capacitance change at a sensing electrode 60, where the sensing electrode 60 comprises a first stray capacitance 62 and a second stray capacitance 64. The signal source 520 is electrically coupled with the first impedance 542 and the second impedance 522a. The first impedance 542 is electrically coupled with the first capacitor 544 and the first capacitor 544 is electrically coupled with the first input end 540a of the differential amplifier 540. The second impedance 522a is electrically coupled with the second input end 540b of the differential amplifier 540. The sensing electrode 60 is electrically coupled to the second impedance 522a and the second input end 540b through a node (such as an IC pin) of the self-capacitance sensing circuit 106. The first stray capacitance 62 is electrically coupled to the node and the second stray capacitance 64 is electrically coupled to the sensing electrode 60.

In the self-capacitance sensing circuit 106 shown in FIG. 16, the sensing electrode 60 receives a touch signal when a finger or a conductor is touched thereon. The signal source 520 is a periodical signal and sent to the third impedance 522, while the resistance values of the first impedance 542 and the second impedance 522a are identical. The differential amplifier 540 will generate a differential touch signal after receiving the signal source 520 and the touch signal from the sensing electrode 60. In this embodiment, the capacitance of the first capacitor 544 is equal to the resulting capacitance of the first stray capacitance 62 in parallel connection with the second stray capacitance 64. The capacitance of the second stray capacitance 64 changes when user finger approaches or touches the sensing electrode 60. Therefore, the voltages fed to the first input end 540a and the second input end 540b will be different such that the differential amplifier 540 has a (non-zero) differential output at the output end 540c. In this way, the minute capacitance change on the sensing electrode 60 can be detected by the differential amplifier 540. Moreover, the noise from circuits or power source can be advantageously removed. The detail of the self-capacitance sensing circuit 106 can be referred to U.S. Pat. No. 8,704,539 (corresponding to Taiwan patent No. I473001) filed by the same applicant.

The yield of the fingerprint identification apparatus is enhanced and the cost of the fingerprint identification apparatus 10 is reduced by attaching (assembling) the fingerprint identification IC chip, the polymer film substrate and the decorative layer.

Thus, particular embodiments have been described. Other embodiments are within the scope of the following claims. For example, the actions recited in the claims may be performed in a different order and still achieve desirable results.

What is claimed is:

1. A fingerprint identification apparatus comprising:
   a fingerprint identification integrated circuit (IC) chip comprising a plurality of metal bumps arranged on one side of the fingerprint identification IC chip;
   a polymer film substrate comprising a plurality of conductive pads and the polymer film substrate arranged on one side of the fingerprint identification IC chip with the metal bumps, at least part of the conductive pads being corresponding to and electrically connected to the metal bumps; and
   a decorative layer arranged on one side of the polymer film substrate opposite to the fingerprint identification IC chip,
   wherein the fingerprint identification IC chip further comprises a fingerprint identification circuit and the fingerprint identification circuit comprises at least a self-capacitance sensing circuit.

2. The fingerprint identification apparatus in claim 1, further comprising a protection layer arranged on a side of the decorative layer opposite to the fingerprint identification IC chip.

3. The fingerprint identification apparatus in claim 1, wherein the polymer film substrate comprises a plurality of conductive electrodes on a side opposite to the fingerprint identification IC chip, the conductive electrodes and part of the conductive pads on the other side of the polymer film substrate are in one-by-one correspondence.

4. The fingerprint identification apparatus in claim 1, wherein the decorative layer has predetermined color or pattern and is arranged on one side of the polymer film substrate by printing, depositing, sputtering, evaporating, or bonding.

5. The fingerprint identification apparatus in claim 2, wherein the decorative layer has predetermined color or pattern and is arranged on one side of the protection layer by printing, depositing, sputtering, evaporating, or bonding.

6. The fingerprint identification apparatus in claim 2, wherein the protection layer is a glass layer, a ceramic layer, a sapphire layer, a hard polymer material layer, or a cured coating layer.

7. The fingerprint identification apparatus in claim 6, wherein the protection layer comprises a plurality of conductive electrodes on a side toward the fingerprint identification IC chip, the conductive electrodes of the protection layer and a part of the metal bumps of the fingerprint identification IC chip are in one-by-one correspondence.

8. The fingerprint identification apparatus in claim 1, wherein the fingerprint identification IC chip is arranged on the polymer film substrate through anisotropic conductive film (ACF).

9. The fingerprint identification apparatus in claim 1, wherein the fingerprint identification IC chip is arranged on the polymer film substrate through pressure soldering of a low melting point material.

10. The fingerprint identification apparatus in claim 2, wherein the protection layer is a protection glass of a display.

11. A method for manufacturing a fingerprint identification apparatus, the method comprising:
    providing a fingerprint identification integrated circuit (IC) chip, the fingerprint identification IC chip comprising a plurality of metal bumps arranged on one side of the fingerprint identification IC chip;

providing a polymer film substrate, the polymer film substrate comprising a plurality of conductive pads arranged on one side of the polymer film substrate;

forming a decorative layer on a side of the polymer film substrate opposite to the conductive pads by printing, depositing, sputtering, evaporating, or bonding; and pressing or soldering the fingerprint identification IC chip on a surface of the polymer film substrate such that the metal bumps and a part of the conductive pads are in one by one correspondence, wherein the fingerprint identification IC chip further comprises a fingerprint identification circuit and the fingerprint identification circuit comprises at least a self-capacitance sensing circuit.

12. The method in claim 11, further comprising: coating a hard material with high dielectric constant to a side of the decorative layer opposite to the polymer film substrate.

13. The method in claim 11, further comprising: attaching a hard material with high dielectric constant to a side of the decorative layer opposite to the polymer film substrate.

14. The method in claim 13, wherein the hard material with high dielectric constant is a sapphire material, a ceramic material or a glass material.

15. The method in claim 11, further comprising: pressing an electronic device outside the fingerprint identification IC chip on the polymer film substrate.

16. The method in claim 15, wherein the electronic device includes an integrated circuit.

17. The method in claim 11, wherein the fingerprint identification IC chip is arranged on the polymer film substrate through anisotropic conductive film (ACF).

18. The method in claim 11, wherein the fingerprint identification IC chip is arranged on the polymer film substrate through pressure soldering of a low melting point material.

* * * * *